United States Patent
Heidenbauer

(10) Patent No.: US 8,309,244 B2
(45) Date of Patent: Nov. 13, 2012

(54) HIGH-VOLTAGE BATTERY COMPRISING A CONNECTOR UNIT, AND CONNECTOR UNIT FOR SUCH A BATTERY

(75) Inventor: Oliver Heidenbauer, Köflach (AT)

(73) Assignee: MAGNA STEYR Fahrzeugtechnik AG & Co KG, Graz (AT)

( * ) Notice: Subject to any disclaimer, the term of this patent is extended or adjusted under 35 U.S.C. 154(b) by 245 days.

(21) Appl. No.: 12/441,690

(22) PCT Filed: Sep. 14, 2007

(86) PCT No.: PCT/EP2007/008011
§ 371 (c)(1),
(2), (4) Date: Nov. 18, 2009

(87) PCT Pub. No.: WO2008/034560
PCT Pub. Date: Mar. 27, 2008

(65) Prior Publication Data
US 2010/0104932 A1   Apr. 29, 2010

(30) Foreign Application Priority Data

Sep. 18, 2006   (AT) ............................. GM684/2006 U

(51) Int. Cl.
*H01M 2/10* (2006.01)
(52) U.S. Cl. ........................ 429/99; 429/149; 320/116
(58) Field of Classification Search ................ 429/7, 99, 429/149, 164, 175; 320/107, 116
See application file for complete search history.

(56) References Cited

U.S. PATENT DOCUMENTS

| | | | |
|---|---|---|---|
| 6,275,003 B1 * | 8/2001 | Marukawa et al. | 320/116 |
| 6,346,011 B1 | 2/2002 | Ikeda | |
| 6,399,238 B1 | 6/2002 | Oweis et al. | |
| 2006/0057458 A1 * | 3/2006 | O'Dea et al. | 429/164 |
| 2008/0118821 A1 * | 5/2008 | Gehring et al. | 429/92 |

FOREIGN PATENT DOCUMENTS

| | | |
|---|---|---|
| EP | 1109237 A1 | 6/2001 |
| EP | 1363483 | 11/2003 |
| JP | 2001185663 | 7/2001 |
| WO | 2005/039012 | 4/2005 |

* cited by examiner

*Primary Examiner* — Jennifer Michener
*Assistant Examiner* — Monique Wills
(74) *Attorney, Agent, or Firm* — Bachman & LaPointe, P.C.

(57) ABSTRACT

A high-voltage battery comprising a number of cells (2) that are arranged in rows, a support structure (3), and a cover plate on which high-current connectors (24) for the individual cells and a cell monitoring unit (9) are mounted. In order to reduce production, assembly, and logistics costs, the cover plate (6) is embodied as a multilayer printed board encompassing at least two conducting layers (15, 17). The first conducting layer (15) is mounted on the side of the printed board facing the cells (2) and has a considerable thickness in order to form the high-current connectors (24), while the second conducting layer (17) has a small thickness and forms the connecting lines (20) to the cell monitoring unit (9). The two layers (15, 17) are interconnected at certain points by means of conducting bores (19) that penetrate the printed board.

3 Claims, 3 Drawing Sheets

HIGH-VOLTAGE BATTERY COMPRISING A CONNECTOR UNIT, AND CONNECTOR UNIT FOR SUCH A BATTERY

BACKGROUND OF THE INVENTION

The invention relates to a high-voltage battery comprising a number of cylindrical cells which are arranged in rows, a support structure for the cells, and a cover plate, to which cover plate high-current connectors for the individual cells and a cell monitoring unit are fitted. In this case, a battery should be understood as meaning all types of electrical storage devices: chemical, capacitive etc.

Such batteries have recently been used in different arrangements to drive motor vehicles. They can provide the high currents required for this but must not only be cooled but also continuously monitored for this purpose.

In the case of known batteries of the generic type, the high-current connectors of the individual cells and conductors to the external connections, which conductors have been inserted into suitable recesses in the cover plate, are made of copper. The cell monitoring unit is a separate unit which is fitted above the cover plate and is connected to the poles of the individual cells via individual conductors, wires or lamellas of sheet copper, often also via plug-in connectors. These connections are exposed to corrosion and vibrations, with the result that malfunctions occur.

The manufacturing and assembly complexity for such a battery is very high on account of the large number of components and the complicated shape of the cover plate (see, for instance, EP 1109237 B1) and because the individual conductors have to be individually inserted and fastened into the cover plate and connected to one another. Moreover, differently arranged cell connectors and also different cover plates must be available for different (vehicle-specific) designs of the battery.

EP 1363483 A2 discloses a method for producing multilayer printed circuit boards for mechatronic apparatuses in the automotive sector, which printed circuit boards are suitable for high-current and signal current applications.

The object of the invention is to improve a high-voltage battery to the effect that it gives rise to lower production, assembly and logistical costs.

SUMMARY OF THE INVENTION

According to the invention, the cover plate is a multilayer printed circuit board having at least two conductive layers, the first of which is fitted to the side of the printed circuit board facing the cells and has a considerable thickness for the purpose of forming the high-current connectors, and the second of which has a small thickness and forms the connecting lines to the cell monitoring unit, the two layers being connected to one another at certain points by means of conductive holes which pass through the printed circuit board.

The conductive layers are treated using known removal or etching methods, with the result that they form the conductors. If the thick layer, from which the material has been removed between the conductors, of the cover plate rests on the poles of the cells, the latter are directly connected to the conductors without further connecting elements. The conductors formed in the further, thin conductive layer are connected to the corresponding measurement points, usually on the current-carrying conductors, via the holes. All necessary connections are produced in this manner with a single plate without further assembly work.

In a development of the invention, the second layer also contains the components which form the cell monitoring unit. A conceivably high degree of integration is thus achieved.

BRIEF DESCRIPTION OF THE DRAWINGS

The invention is described and explained below using Figures, in which.

DETAILED DESCRIPTION

Figure 1:
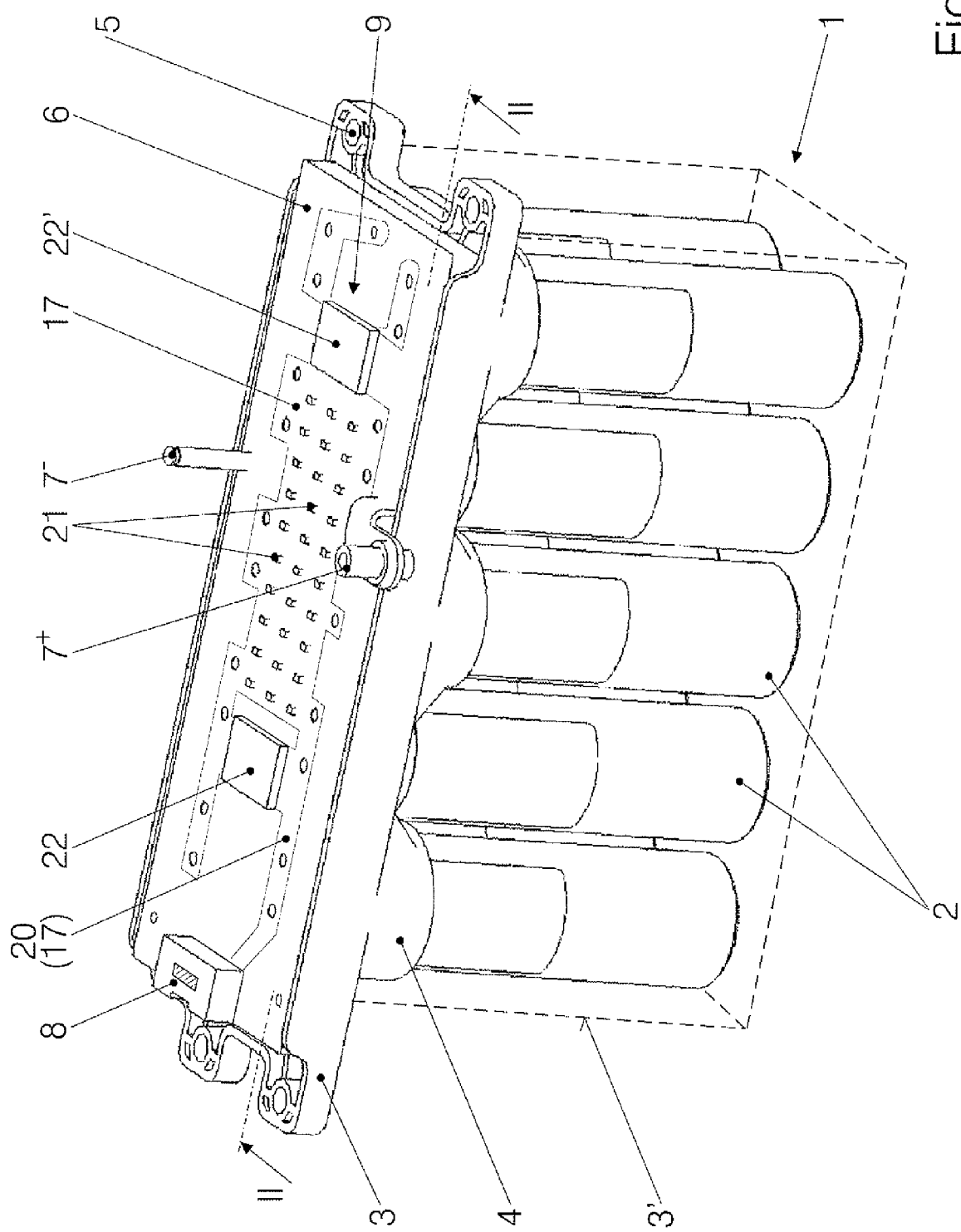
FIG. 1: axonometrically shows a battery according to the invention.

In FIG. 1, a high-voltage battery is denoted summarily with 1. It comprises a number of cylindrical cells arranged in this case in two rows of five, a support structure 3 having fastening lugs 5 for fastening in a motor vehicle, and a cover plate 6. In this case, the support structure 3 has the form of a plate with downwardly directed flanges 4 in which the cells 2 are fastened. However, said support structure could also form a box 3' which is indicated using dashed lines. Upwardly directed connections 7+, 7− for connection to a high-current system (not illustrated) and a plug-in connection 8 for connection to or from a cell monitoring unit or a unit for battery management are on the support structure 3.

Figure 2:
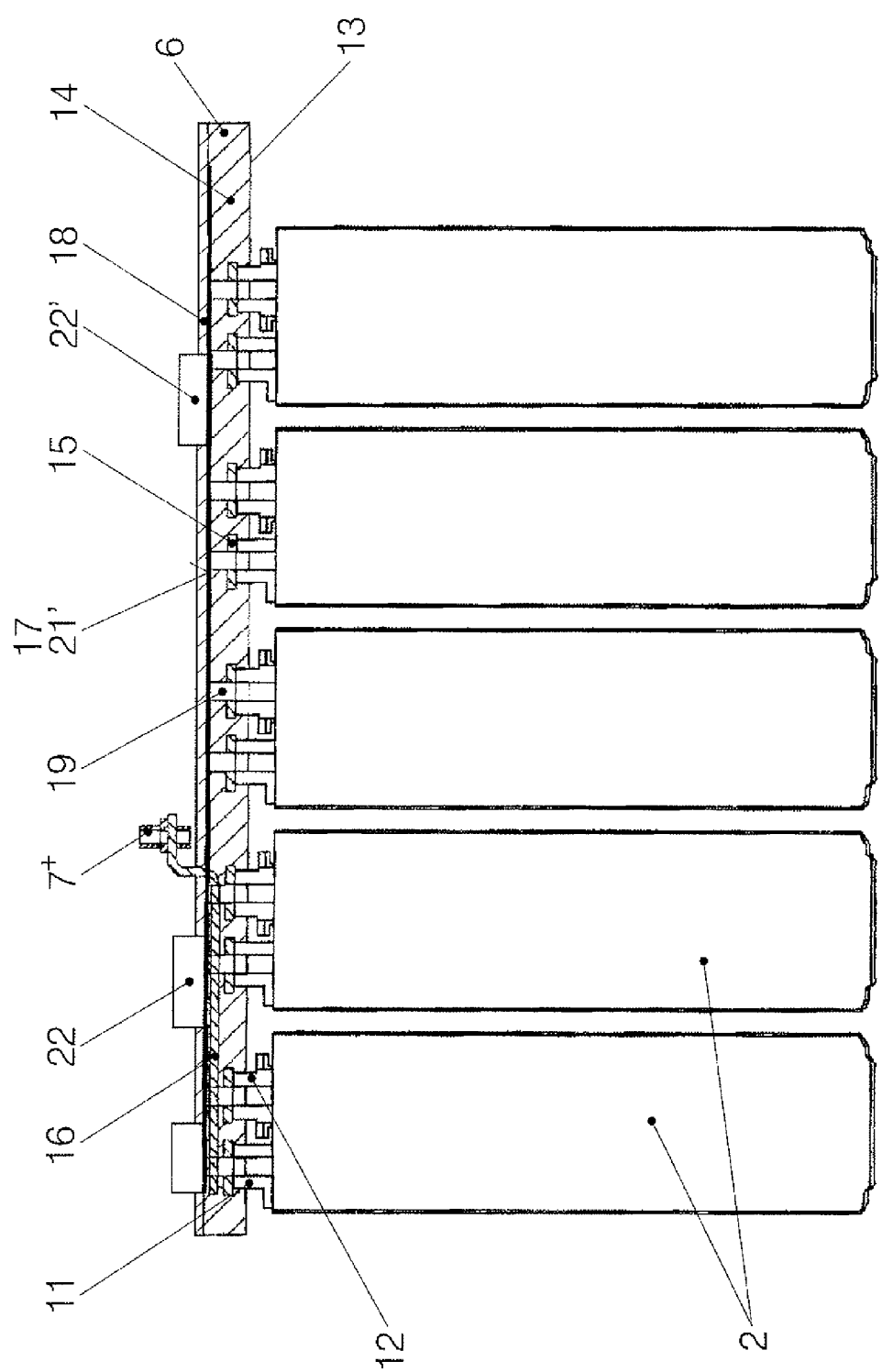
FIG. 2: shows a vertical section according to II-II in FIG. 1.

The support structure has been omitted in the vertical section in FIG. 2; only the cells 2 with their poles 11, 12 and the cover plate 6 can now be seen. The cover plate 6 is a multilayer printed circuit board whose matrix is composed of an insulating plastic. A first conductive layer 15 with a considerable thickness for forming high-current connectors of the poles 11, 12 of the cells 2 is removed in places somewhat above a base surface 13. This first conductive layer 15 could also be applied to the outside of the base surface 13. This layer as well as the further conductive layers are preferably composed of copper and are introduced or applied, for example, according to the method described in EP 1 363483 A2. In the exemplary embodiment shown, a further layer 16 with a considerable thickness is provided at least in places in order to produce the connection to the vehicle or to a power circuit (see further below).

A second conductive layer 17 with a small thickness (see also FIG. 1) is applied to the (upper) surface of the cover plate 6, parts 22, 22' being fitted to or integrated in said layer. In the latter case, pole connecting lines 25 (FIG. 3) are also formed from the same layer (15) or from a further first layer. An insulating cover layer 18 may also be applied above the second layer 17 and the electronic components 17, 21. In order to connect the poles 11, 12 of the cells 2 to the second layer 17, holes 19 which pierce the cover plate 6 and the interior of which is made to be conductive—whether by filling or by coating the walls—and which thus connect the first conductive layer 15 to the second conductive layer 17 at these points are provided.

FIG. 1 again generally illustrates the cell monitoring unit (denoted summarily with 9 in this case) with its connecting conductors 20, electronic components 21 and further electronic components 22, without claiming specificity. In one simplified embodiment, only the connections 20 and certain electronic components 21 would be in the form of a printed circuit on the cover plate 6, and the plug-in connection 8 would produce the connection to an evaluation unit outside the battery 1. In the exemplary embodiment shown, the evaluation unit is accommodated in the further components 22, 22'.

Figure 3:
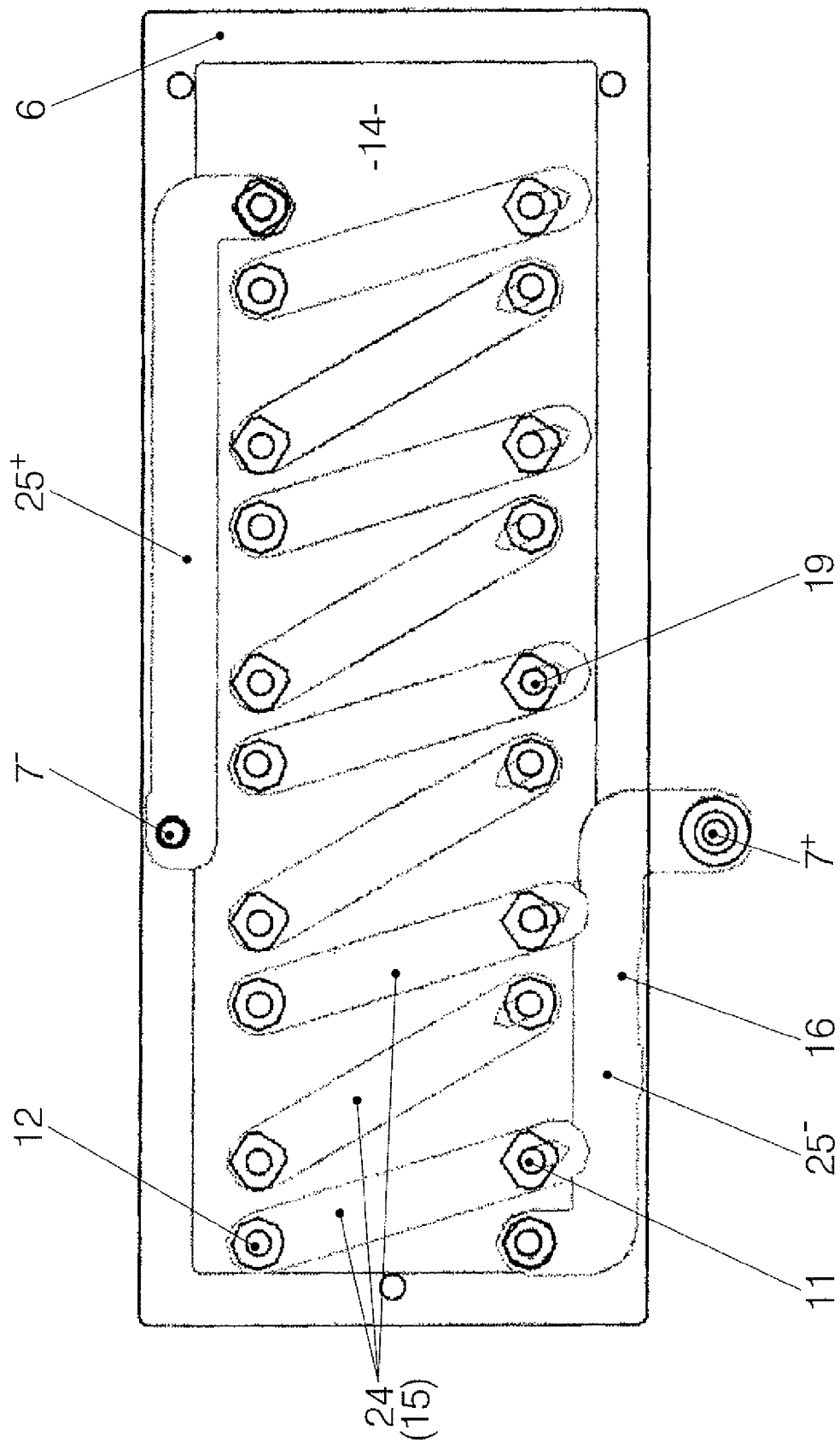
FIG. 3: shows a view of the cover from below.

FIG. 3 shows the cover plate 6 from below, the matrix 14 of which is assumed to be transparent. It is possible to see the high-current connectors 24 associated with the poles 11, 12 of the individual cells 2 and the pole connectors 25, 25+, 25− which are arranged in another plane in this case and provide a load with current via the connections 7+, 7−. The holes 19 produce the connection to the line connections 20 above which have been produced from the second conductive layer 17.

The cover plate 6 which is designed to be integral in the manner described can be inserted into the support structure or placed onto the cells 2 in a completely assembled manner. The high-current connectors 24 produced from the thick conductive layer thus rest on the poles 11, 12 of the cells 2 without further fastening elements. During assembly, the cover plate 6 thus only needs to be placed onto the support structure 3 and the battery is ready for use.

The invention claimed is:

1. A high-voltage battery comprising a plurality of cells (2) arranged in rows, a support structure (3), and a cover plate, the cover plate has high-current connectors (24) for the individual cells and a cell monitoring unit (9) fitted thereto, the cover plate (6) comprises a multilayer printed circuit board having at least two conductive layers (15, 17), the first conductive layer is fitted to a side of the printed circuit board facing the cells (2) and has a suitable thickness for forming the high-current connectors (24), and the second conductive layer has a smaller thickness than the first conductive layer and forms connecting lines (20) to the cell monitoring unit (9), the two conductive layers (15, 17) are connected to one another by conductive holes (19) which pass through the printed circuit board.

2. The high-voltage battery as claimed in claim 1, wherein the second conductive layer (17) contains components (21, 22) which form the cell monitoring unit.

3. A cover plate for a high-voltage battery comprising a number of cells (2) arranged in rows, and a support structure (3), fitted to the cover plate high-current connectors (24) for the individual cells and a cell monitoring unit (9), the cover plate (6) comprises a multilayer printed circuit board having at least two conductive layers (15, 17), the first (15) conductive layer is fitted to a side of the printed circuit board facing the cells (2) and has a suitable thickness for forming the high-current connectors (24), and the second (17) conductive layer has a smaller thickness than the first conductive layer and forms the connecting lines (20) to the cell monitoring unit (9), the two conductive layers (15, 17) being connected to one another by conductive holes (19) which pass through the printed circuit board.

* * * * *